(12) United States Patent
Liu et al.

(10) Patent No.: US 11,695,098 B2
(45) Date of Patent: Jul. 4, 2023

(54) HIGH VOLTAGE LIGHT-EMITTING DIODE AND METHOD OF PRODUCING THE SAME

(71) Applicant: Xiamen Changelight Co. Ltd., Xiamen (CN)

(72) Inventors: Yingce Liu, Xiamen (CN); Junxian Li, Xiamen (CN); Zhao Liu, Xiamen (CN); Zhendong Wei, Xiamen (CN); Xuan Huang, Xiamen (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 232 days.

(21) Appl. No.: 16/680,483

(22) Filed: Nov. 11, 2019

(65) Prior Publication Data

US 2020/0251616 A1 Aug. 6, 2020

(30) Foreign Application Priority Data

Feb. 2, 2019 (CN) .......................... 201910106867.8
Feb. 2, 2019 (CN) .......................... 201910106878.6

(51) Int. Cl.
*H01L 21/768* (2006.01)
*H01L 23/522* (2006.01)
(Continued)

(52) U.S. Cl.
CPC .......... *H01L 33/387* (2013.01); *H01L 27/153* (2013.01); *H01L 33/22* (2013.01);
(Continued)

(58) Field of Classification Search
CPC ..... H01L 33/387; H01L 27/153; H01L 33/22; H01L 33/44; H01L 2933/0016;
(Continued)

(56) References Cited

U.S. PATENT DOCUMENTS 9,356,189 B2 * 5/2016 Wu ...................... H01L 33/0095
2009/0020781 A1 * 1/2009 Lai .......................... H01L 33/22
257/103

(Continued)

FOREIGN PATENT DOCUMENTS

CN 104465691 A * 3/2015
CN 105655450 A * 6/2016
(Continued)

*Primary Examiner* — Marcos D. Pizarro
*Assistant Examiner* — Tenley H Schofield
(74) *Attorney, Agent, or Firm* — Arch & Lake LLP

(57) ABSTRACT

A light-emitting diode (LED) sub-chip and a method of producing the same are provided. The LED sub-chip comprises an epitaxial layer disposed on a growth substrate, where the epitaxial layer comprises a plurality of electrodes. The groove disposed between the LED sub-chip and a second LED sub-chip, where the groove penetrates through the epitaxial layer separating the two sub-chips. The bridge insulating layer at least partially covering a sidewall of the groove, where the sidewall comprises a first surface and a second surface above the first surface, where the texture of the second surface is less granular than a texture of the first surface. The bridge electrode on the bridge insulating layer, where the bridge electrode connects respective electrodes of the two sub-chips at the first surface.

8 Claims, 14 Drawing Sheets

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)
*H01L 33/38* (2010.01)
*H01L 27/15* (2006.01)
*H01L 33/44* (2010.01)
*H01L 33/22* (2010.01)

(52) U.S. Cl.
CPC ...... *H01L 33/44* (2013.01); *H01L 2933/0016* (2013.01); *H01L 2933/0025* (2013.01)

(58) Field of Classification Search
CPC ........... H01L 2933/0025; H01L 33/025; H01L 33/0095; H01L 21/26586; H01L 21/2654; H01L 29/34; H01L 33/145; H01L 33/20; H01L 27/156; H01L 33/12; H01L 33/62; H01L 2933/0066; H01L 33/007; H01L 2224/48091; H01L 2924/00014
See application file for complete search history.

(56) References Cited

U.S. PATENT DOCUMENTS

| | | | | |
|---|---|---|---|---|
| 2011/0089444 A1* | 4/2011 | Yao | ............................ | F21K 9/00 |
| | | | | 257/93 |
| 2011/0220932 A1* | 9/2011 | Katsuno | ................. | H01L 33/382 |
| | | | | 257/E33.012 |
| 2013/0221391 A1* | 8/2013 | Hsu | ...................... | H01L 33/0093 |
| | | | | 257/98 |
| 2013/0292692 A1* | 11/2013 | Hung | ...................... | H01L 33/22 |
| | | | | 257/76 |
| 2015/0021638 A1* | 1/2015 | Oh | ......................... | H01L 33/387 |
| | | | | 257/91 |
| 2015/0270432 A1* | 9/2015 | Wu | ...................... | H01L 33/0095 |
| | | | | 438/33 |
| 2017/0110638 A1* | 4/2017 | Wu | ........................ | H01L 27/156 |

FOREIGN PATENT DOCUMENTS

| | | | | |
|---|---|---|---|---|
| CN | 104733573 B | * | 12/2017 | ......... H01L 33/0066 |
| CN | 107516701 A | * | 12/2017 | |

* cited by examiner

US 11,695,098 B2

HIGH VOLTAGE LIGHT-EMITTING DIODE AND METHOD OF PRODUCING THE SAME

CROSS-REFERENCE TO RELATED APPLICATIONS

This application claims the benefits of Chinese Patent Applications No. CN201910106867.8 and CN201910106878.6, both of which were filed on Feb. 2, 2019, in the State Intellectual Property Office of China, the entire contents of which are incorporated herein by reference in their entireties.

TECHNICAL FIELD

The present disclosure relates to semiconductor technology, particularly high voltage light-emitting diode (LED) chip and the method of producing the same.

BACKGROUND

LED is commonly referred to as a cold light source with significant advantages over incandescent sources. LED chips are widely used due to these advantages, resulting in an increased demand for improved chips with greater luminosity.

Previous generations of LED chips generally had low luminosity due to their inability to handle higher voltages. Recently, high-voltage LED chips have been developed with some success. However, the luminous efficiency of these high-voltage chips could be improved.

SUMMARY

According to a first aspect of the present disclosure, there is provided an LED device. The LED device includes: an epitaxial layer disposed on a growth substrate, wherein the epitaxial layer comprises a plurality of electrodes; a groove disposed between the LED sub-chip and a second LED sub-chip, wherein the groove penetrates through the epitaxial layer separating the two sub-chips; a bridge insulating layer at least partially covering a sidewall of the groove, wherein the sidewall comprises: a first surface and a second surface above the first surface, wherein a texture of the second surface is less granular than a texture of the first surface; and a bridge electrode on the bridge insulating layer, wherein the bridge electrode connects respective electrodes of the two sub-chips at the first surface.

According to a second aspect of the present disclosure, there is provided a method for producing an LED device. The method includes providing a growth substrate; forming an epitaxial layer disposed on top of a growth substrate; opening a groove through the epitaxial layer separating two sub-chips of the LED chip, wherein the sub-chips comprises a plurality of electrodes on the epitaxial layer; forming a first surface on a sidewall of the groove; wherein the electrodes are situated on the first surface; forming a second surface above the first surface, wherein a texture of the second surface is less granular than a texture of the first surface; and disposing a bridge insulating layer at least partially covering the sidewall of the groove, wherein the electrodes of the epitaxial layer are connected at the first surface by a bridge electrode situated on the bridge insulating layer.

According to another aspect of the present disclosure, there is provided a method for producing an LED device. The method includes providing a growth substrate; forming an epitaxial layer disposed on top of a growth substrate, wherein the epitaxial layer comprises a first type semiconductor layer, a second type semiconductor layer disposed in a direction away from the growth substrate, and an active layer sandwiched between the first type semiconductor layer and the first type semiconductor layer; opening a groove through the epitaxial layer laterally spacing two sub-chips, wherein the sub-chips comprises a plurality of electrodes on the second type semiconductor layer; forming a connecting surface on a sidewall of the groove, wherein the first surface comprises sidewall of a first portion of the first type semiconductor layer of the epitaxial layer; forming a second surface above the first surface, wherein the second surface comprises the second type semiconductor layer, the active layer, and a second adjacent portion of the first type semiconductor layer; and smoothing a texture of the non-connecting surface to be less granular than a texture of the first surface, and; disposing a bridge insulating layer at least partially covering the sidewall of the groove, wherein the electrodes of the epitaxial layer are connected by a bridge electrode situated on the bridge insulating layer.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate examples consistent with the disclosure and, together with the description, serve to explain the principles of the disclosure.

DETAILED DESCRIPTION

Hereinafter, aspects of the present disclosure will be described in conjunction with the accompanying drawings. The implementations set forth in the following description are merely examples for better understanding of the present disclosure, rather than to limit the present disclosure. Variations of structure, method, or function made by one ordinary skilled in the art based on these examples are all covered in the scope of the present disclosure.

The terms used in present disclosure are merely directed to illustrate the particular examples, rather than limit to the present disclosure. The singular forms "a" "an" and "the" as used in the present disclosure as well as the appended claims also refer to plural forms unless other meanings are definitely contained in the context. It should be appreciated that the term "and/or" as used herein refers to any or all possible combinations of one or more associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one aspect," "an aspect," "another aspect," or the like in the singular or plural means that one or more particular features, structures, or characteristics described in connection with an aspect is included in at least one aspect of the present disclosure. Thus, the appearances of the phrases "in one aspect" or "in an aspect," "in another aspect," or the like in the singular or plural in various places throughout this specification do not necessarily all refer to the same aspect. Furthermore, the particular features, structures, or characteristics in one or more aspects may be included or combined in any suitable manner.

Some aspects of the present disclosure will be described in detail with reference to the accompanying drawings. In the case of no conflict, the following aspects and the features in the aspects may be combined with each other.

Figure 1:
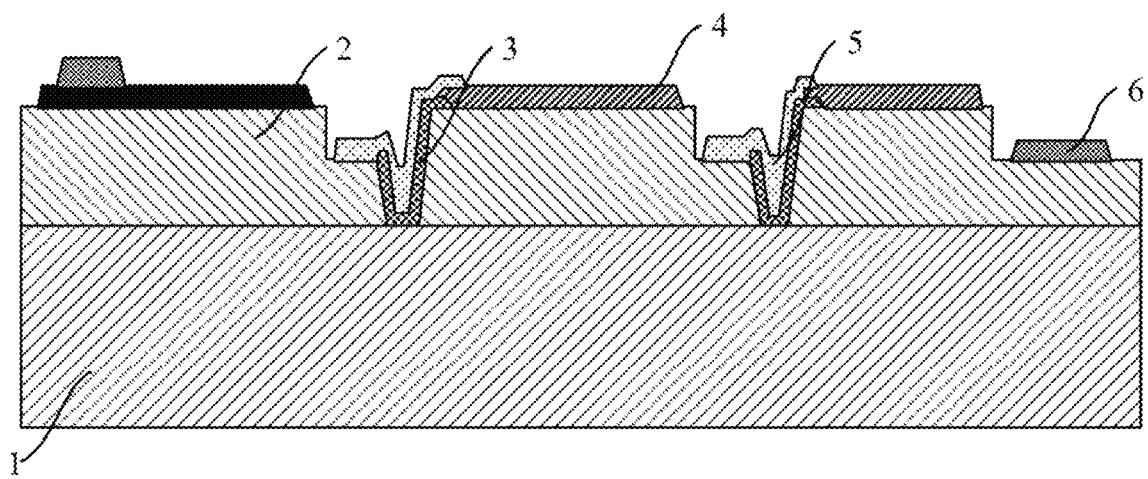
FIG. 1 is the cross-sectional view showing a conventional LED Chip.

FIG. 1 is the cross-sectional view of an LED chip showing three LED sub-chips. As shown in FIG. 1, the LED chip (interchangeably LED device) includes a growth substrate 1, a semiconductor layer 2 forming part of an epitaxial layer, a bridge insulating layer 3X, a transparent conductive layer 4X, a bridge electrode 5X, and a plurality of electrodes 6X of the LED sub-chips.

Figure 2:
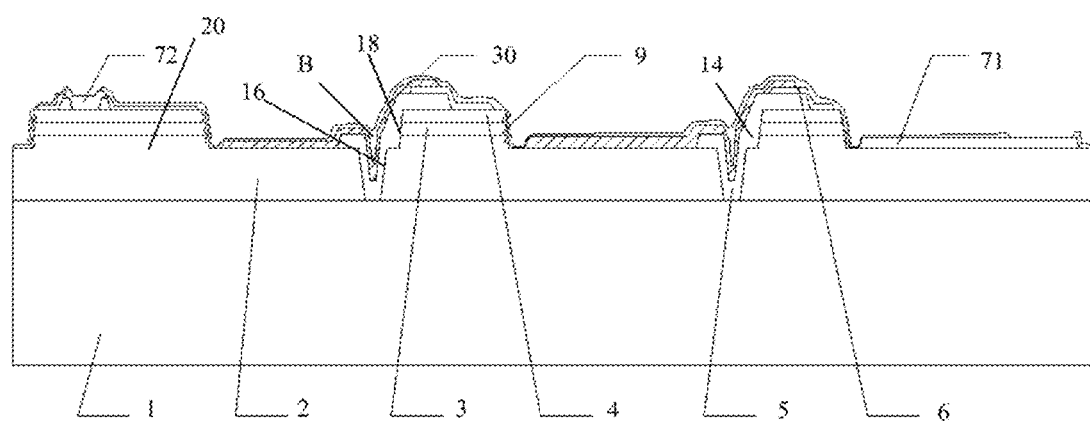
FIG. 2 is the cross-sectional view of a high voltage LED Chip.

An LED chip (interchangeably LED device) in accordance with the present disclosure will be introduced and detailed with reference to FIGS. 2 to 5. In one aspect of the present disclosure, as shown in FIG. 2, the LED device comprises a plurality of LED sub-chips with an LED sub-chip X and a second LED sub-chip Y shown in the figure. More specifically, the LED sub-chips comprise an epitaxial layer 20 disposed on a growth substrate 1, wherein the epitaxial layer 20 comprises a plurality of electrodes, wherein the plurality of electrodes comprise a first electrode 71 and a second electrode 72 as shown also in FIG. 2A; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 30 in FIG. 2, or 8 in FIG. 2A, on the bridge insulating layer 5, wherein the bridge electrode 30 connects respective electrodes of the two sub-chips at the first surface 16. The LED sub-chip may also be referred as LED chip particle or cell.

Preferably, the material of the growth substrate includes but not limited to a sapphire substrate, a silicon substrate, a silicon carbide substrate, and any single core particle of a wafer.

Figure 2A:
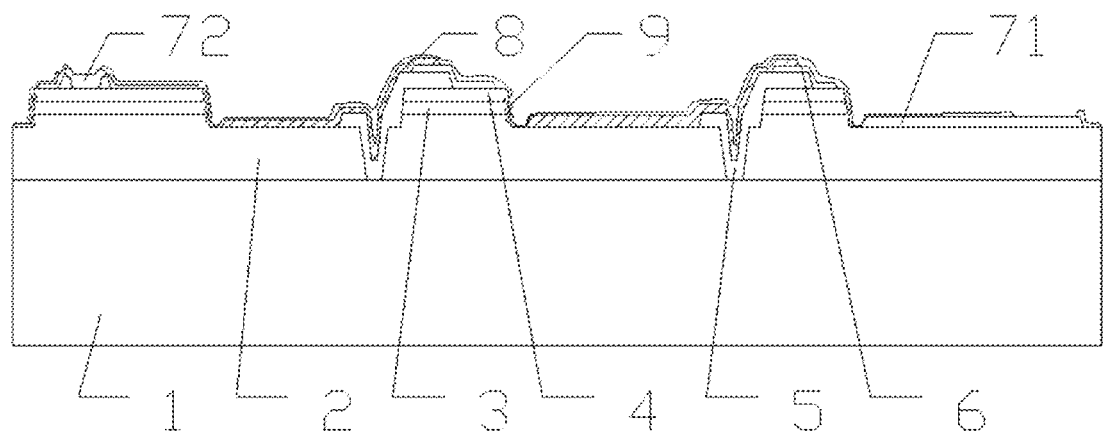
FIG. 2A is the cross-sectional view of a high voltage LED Chip according to another aspect of the present disclosure.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode 8 connects respective electrodes of the two sub-chips at the first surface 16. The second surface 18 is angled more orthogonally with respect to a horizontal surface of the growth substrate 1 than the first surface 16 to the horizontal surface.

Preferably, the second surface sits above the first surface where the first surface is angled with respect to the horizontal surface of the growth substrate is at 130-160 degrees, more preferably 140-150 degrees, even more preferably 145 degrees. In contrast, the angle of the second surface to the horizontal surface is at an angle of 90-120 degrees, preferably 90-110 degrees, more preferably 95 degrees.

Figure 28A:
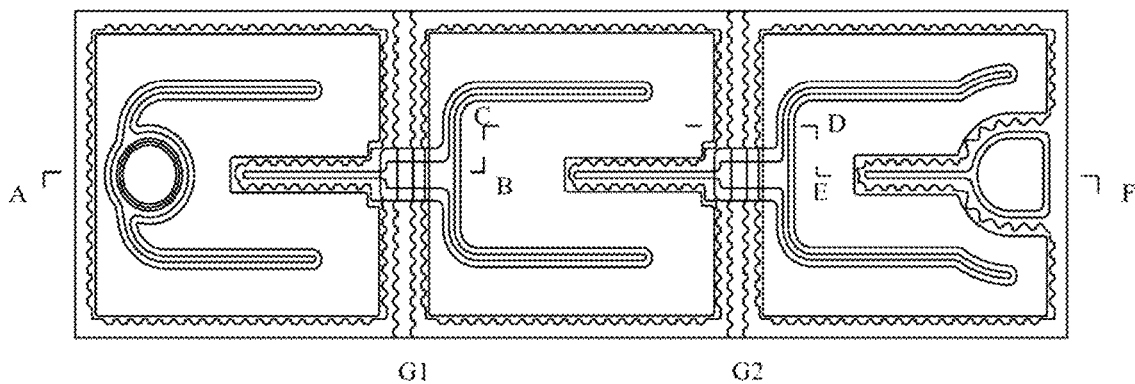
FIG. 28A is a top view showing a high voltage LED chip according to another aspect of the present disclosure.
Figure 28B:
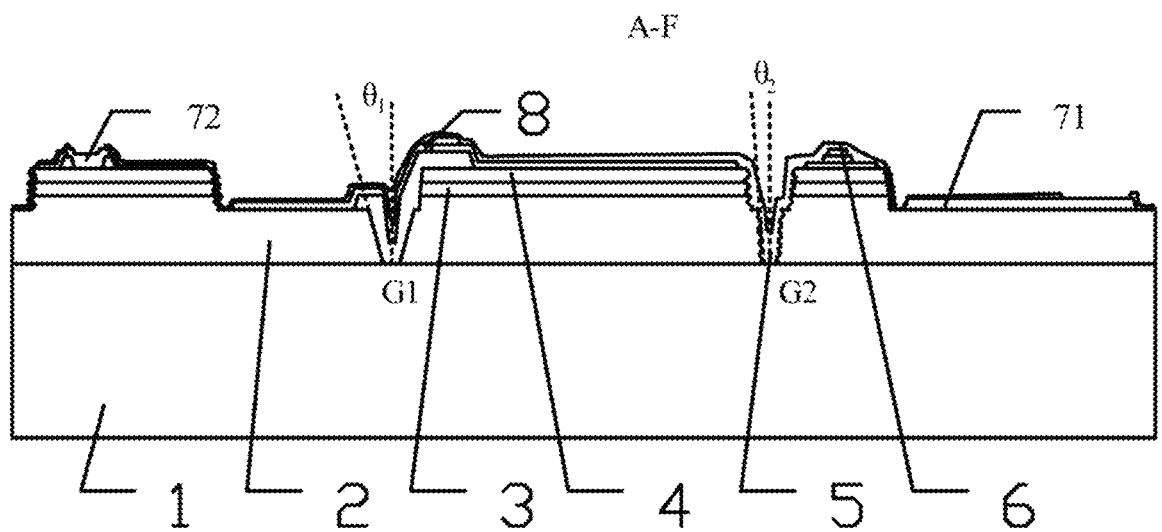
FIG. 28B is a cross-sectional view of the high voltage LED chip of FIG. 28A cut along the polyline A-F.

In some embodiments, as shown in FIGS. 28A and 28B, the side surfaces of the groove at a first location may be less inclined than the side surfaces of the groove at a second location with respect to a horizontal surface of the growth substrate 1. FIG. 28A is a top view showing a high voltage LED chip according to another aspect of the present disclosure. A polyline, or polygonal chain, A-B-C-D-E-F is shown to illustrate a cutting line at different locations of the grooves G1 and G2. In the example, the grooves G1 and G2 may have an identical shape. However, in each of the grooves, a cross-sectional shape may be different at different locations. For example, the groove G1 is cut along line AB, while the groove G2 is cut along line CD. FIG. 28B is a cross-sectional view of the high voltage LED chip of FIG. 28A cut along the polyline A-F.

As shown in FIG. 28B, the second side surface of the groove G2 is angled more orthogonally with respect to the horizontal surface of the growth substrate 1 than the first side surface of the groove G1. In this example, the side surface of the groove G1 cut along line AB is inclined with respect to a vertical line at an angle of $\theta_1$ degrees. Namely, the angle of the side surface at line AB to the horizontal surface is $(90-\theta_1)$ degrees. The side surface of the groove G2 cut along line CD is inclined with respect to a vertical line at an angle of $\theta_2$ degrees. Namely, the angle of the side surface at line CD to the horizontal surface is $(90-\theta_2)$ degrees. The side surface of the groove cut along line CD is less inclined with respect to a vertical line than the side surface cut along line AB. Hence, $\theta_1$ is greater than $\theta_2$ (or $\theta_1 > \theta_2$). In other words, the side surface of each of the grooves G1, G2 is less inclined with respect to a horizontal surface of the growth substrate 1 at locations where the grooves are covered by the bridge insulating layer, and are more inclined with respect to a horizontal surface of the growth substrate 1 at locations where the grooves are not covered by the bridge insulating layer.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. Preferably, the first type semiconductor layer is an N-type semiconductor layer, and the second type semiconductor layer is a P-type semiconductor layer. Optionally, the materials of the N-type semiconductor layer and the P-type semiconductor layer are GaN, GaAs or AlGaN.

Preferably, the first type semiconductor layer may be an N-type layer and the second type semiconductor layer may be a P-type layer; preferably, to form the groove, the N-type and N-type layers may be partially etched away via lithography, etching, and de-bonding. The etching gas may be a mixed gas of $Cl_2/BCl_3/O_2$ or a mixed gas of $Cl_2/BCl_3$. Once etched, the angle of the sidewall to the horizontal surface is at an angle of 90-120 degrees, preferably 90-110 degrees, more preferably 95 degrees.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. The second surface 18 comprises the sidewalls 14 of the second type semiconductor layer 4, the active layer 3 and a portion of the first type semiconductor layer 2 corresponding to the groove B covered by the bridge insulating layer 5.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. The second surface 18 comprises the sidewalls 14 of the second type semiconductor layer 4, the active layer 3 and a portion of the first type semiconductor layer 2 corresponding to the groove B covered by the bridge insulating layer 5. The second surface 18 is irregularly roughened or regularly roughened, for example, it may be roughened with a serrated pattern.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. The second surface 18 comprises the sidewalls 14 of the second type semiconductor layer 4, the active layer 3 and a portion of the first type semiconductor layer 2 corresponding to the groove B covered by the bridge insulating layer 5. The second surface 18 is irregularly roughened or with a serrated pattern. The serrated pattern comprises a zigzag shape of a triangle and a semicircle. By roughening or having roughened portions of the sidewall, it is possible to reduce the light intensity that is emitted laterally, and in turn to reflect the laterally emitted light to the front surface of the LED chip (i.e. light emitting surface of the LED chip), thereby improving the luminous efficiency of the high-voltage LED chip.

The present disclosure improves the luminous efficiency of existing high-voltage LED chips while saving production cost by providing enhanced LED chips and their methods of production. In the enhanced LED chips, the light emission area or surface area is structurally increased to improve the luminous (or lighting) efficiency of the LED.

In another aspect, the first surface may be a smooth surface or a surface that is not roughened as the second surface. The second surface may be roughened by etching or other processes, and may have protrusions of fixed or different shapes or sizes.

In another aspect, to further improve the luminous efficiency in the direction perpendicular to the surface of the high voltage LED chip, it is preferable to set the roughened sidewall or coarsened sidewall in a shape similar to sawtooth. For example, the shape may further be of a structure having a triangular cross-section, or a shape having a semicircular cross-section. The structure having a triangular cross-section may be a pyramid structure, and the pyramid structure may be a triangular pyramid or a quadrangular pyramid structure as long as the lateral light can be purposefully reflected to the front surface of the LED chip.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. The second surface 18 comprises the sidewalls 14 of the second type semiconductor layer 4, the active layer 3 and a portion of the first type semiconductor layer 2 corresponding to the groove B covered by the bridge insulating layer 5. The LED sub-chip further comprises a transparent conductive layer 6 formed on a surface of the bridge insulating layer 5 and on a surface of the second type semiconductor layer 4 facing away from the growth substrate 1. The transparent conductive layer further increases the external luminous efficiency. Preferably, the second surface 18 is irregularly roughened or with a serrated pattern. More preferably, the serrated pattern comprises a zigzag shape of a triangle and a semicircle.

In another aspect, the LED device comprises a plurality of LED sub-chips with an LED sub-chip X and a second LED sub-chip Y shown in FIG. 2 and FIG. 2A. More specifically, the LED sub-chips comprise an epitaxial layer 20 disposed on a growth substrate 1, wherein the epitaxial layer 20 comprises a plurality of electrodes; a groove B disposed between the LED sub-chip X and a second LED sub-chip Y, wherein the groove B penetrates through the epitaxial layer 20 separating the two sub-chips; a bridge insulating layer 5 at least partially covering a sidewall 14 of the groove, wherein the sidewall 14 comprises: a first surface 16 and a second surface 18 above the first surface 16, wherein a texture of the second surface is less granular than a texture of the first surface; and a bridge electrode 8 on the bridge insulating layer 5, wherein the bridge electrode connects respective electrodes of the two sub-chips at the first surface 16. The second surface 18 is angled more orthogonally with respect to a horizontal surface of the growth substrate 1 than the first surface 16 to the horizontal surface. The epitaxial layer 20 comprises a first type semiconductor layer 2, a second type semiconductor layer 4 disposed in a direction away from the growth substrate 1, and an active layer 3 sandwiched between the first type semiconductor layer 2 and the second type semiconductor layer 4. The LED sub-chip further comprises an insulating protective layer 9 covering an outer surface of the entire LED sub-chip except for upper surfaces of the plurality of electrodes. Preferably, the second surface 18 comprises the sidewalls 14 of the second type semiconductor layer 4, the active layer 3 and a portion of the first type semiconductor layer 2 corresponding to the groove B covered by the bridge insulating layer 5. More preferably, the second surface 18 is irregularly roughened or with a serrated pattern. Even more preferably, the serrated pattern comprises a zigzag shape of a triangle and a semicircle.

Figure 3:
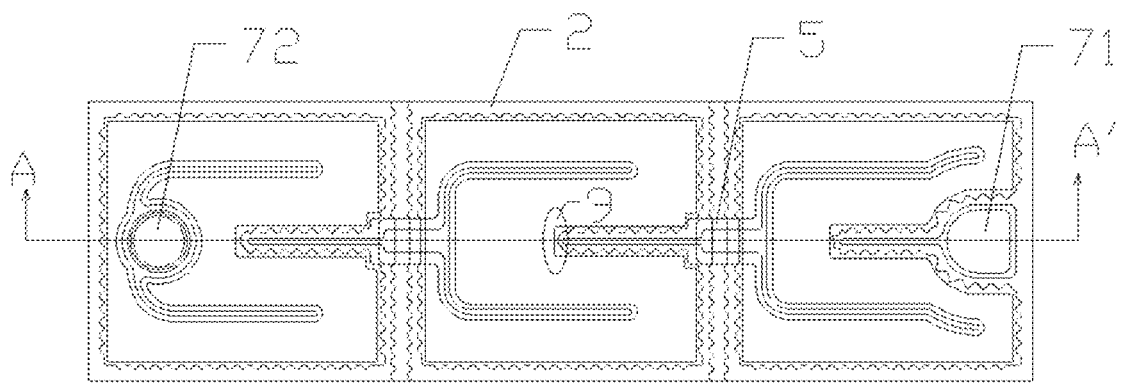
FIG. 3 is the top view showing the high voltage LED Chip in FIG. 2.

FIG. 3 is the top view showing the high voltage LED Chip according to another aspect of the present disclosure. The figure illustrates a plurality of electrodes 71, 72 of the LED chip, the first type semiconductor 2 which is a part of the epitaxial layer 20, the bridge insulating layer 5 covering the groove, an insulating protective layer 9 covering an outer surface of the entire LED sub-chip.

Figure 4:
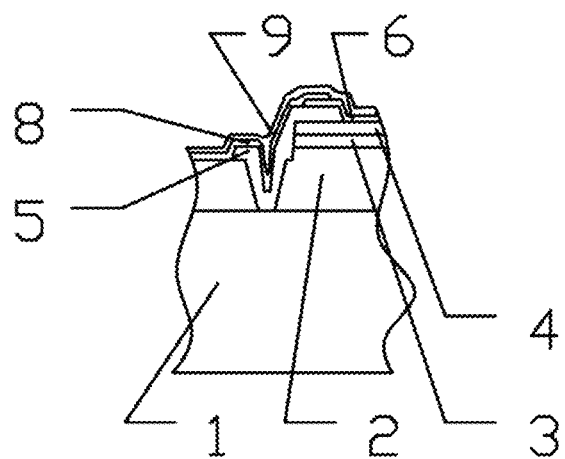
FIG. 4 is the cross-sectional view of a high voltage LED sub-chip according to another aspect of the present disclosure.
Figure 5:
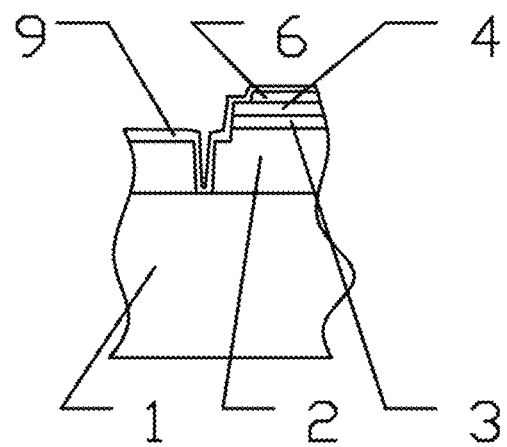
FIG. 5 is the cross-sectional view of a high voltage LED sub-chip according to another aspect of the present disclosure.

FIGS. 4 and 5 is an enlarged cross-sectional view of a high voltage LED sub-chip according to another aspect of the present disclosure. The figure illustrates the epitaxial layer 20, first type semiconductor layer 2, active layer 3, second type semiconductor layer 4, transparent conductive layer 6, insulating protective layer 9, and the bridge insulating layer 5, a bridge electrode 8.

Figure 8:
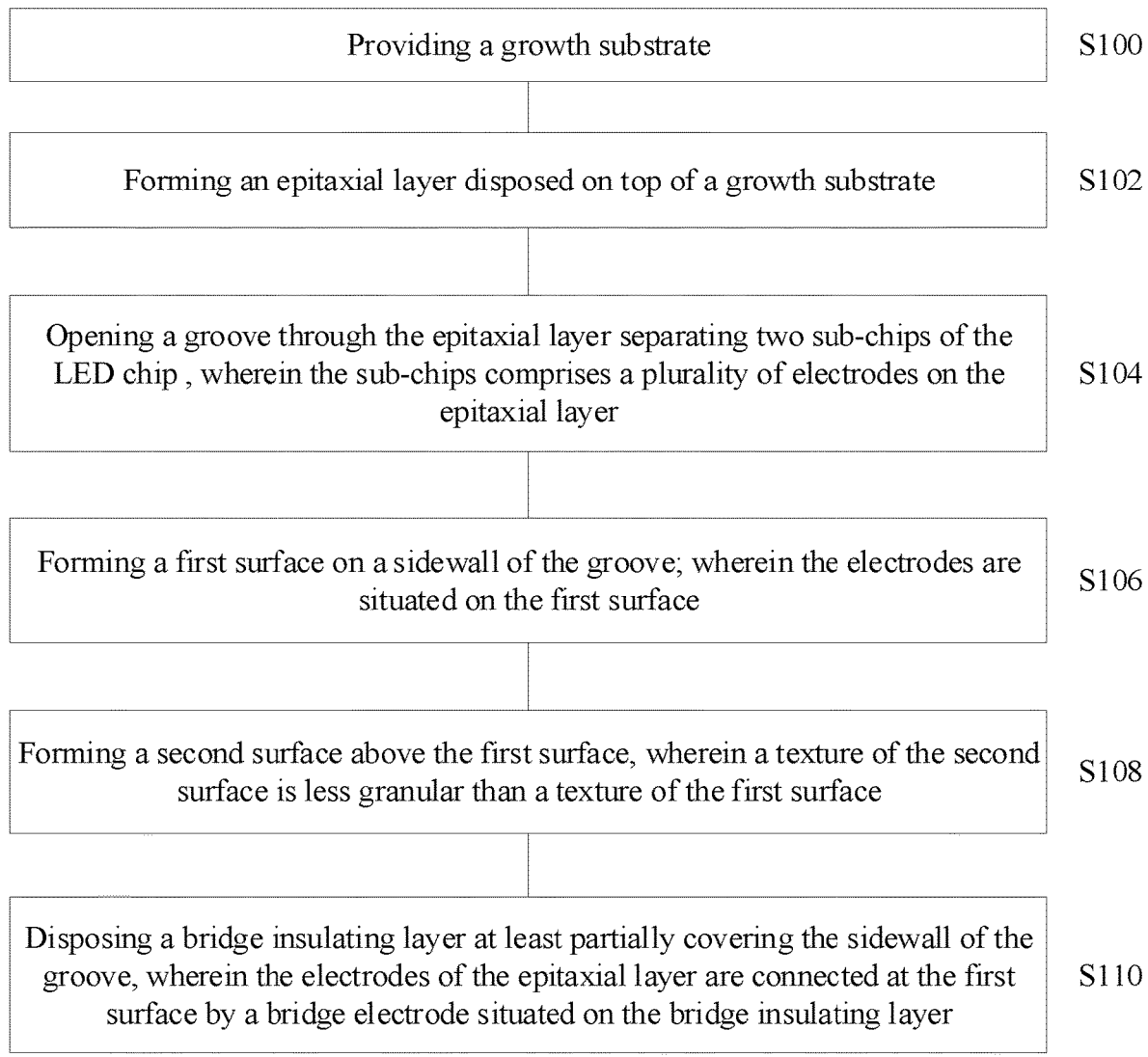
FIG. 8 is an exemplary flow chart illustrating a method for producing an LED sub-chip according to one aspect of the present disclosure.

Moreover, a method of producing (or manufacturing) the LED device in accordance with the present disclosure is provided and detailed with reference to FIGS. 8 and 9. In the final step, grinding, polishing, cutting, forming a single LED chip may be required. As shown in FIG. 8, a method for manufacturing an LED sub-chip of the LED device comprises: providing a growth substrate S100; forming an epitaxial layer disposed on top of a growth substrate S102; opening a groove through the epitaxial layer separating two sub-chips of the LED chip, wherein the sub-chips comprises a plurality of electrodes on the epitaxial layer S104; forming a first surface on a sidewall of the groove, wherein the electrodes are situated on the first surface S106; forming a second surface above the first surface, wherein a texture of the second surface is less granular than a texture of the first surface S108; and disposing a bridge insulating layer at least partially covering the sidewall of the groove, wherein the electrodes of the epitaxial layer are connected at the first surface by a bridge electrode situated on the bridge insulating layer S110. Preferably, the groove B has a lateral width between two sub-chips and a horizontal width 300, and wherein the lateral width is shorter than a horizontal width. The structures corresponding to each method steps in this application to produce the LED chip are further detailed in FIGS. 10 to 27.

The first surface is angled more orthogonally with respect to a horizontal surface of the growth substrate than the second surface to the horizontal surface.

The epitaxial layer comprises a first type semiconductor layer, a second type semiconductor layer disposed in a direction away from the growth substrate, and an active layer sandwiched between the first type semiconductor layer and the first type semiconductor layer. Optionally, the first type semiconductor layer is an N-type semiconductor layer, in particular, an N-type GaN layer; the second type semiconductor layer is a P-type semiconductor layer, and particularly a P-type GaN layer.

The second surface comprises the sidewalls of the second type semiconductor layer, the active layer and a portion of the first type semiconductor layer corresponding to the groove covered by the bridge insulating layer.

The method for manufacturing the LED sub-chip further comprises forming a transparent conductive layer on a surface of the bridge insulating layer and on a surface of the second type semiconductor layer facing away from the growth substrate.

The method for manufacturing the LED sub-chip further comprises forming an insulating protective layer covering an outer surface of the entire LED sub-chip except upper surfaces of the plurality of electrodes.

Figure 9:
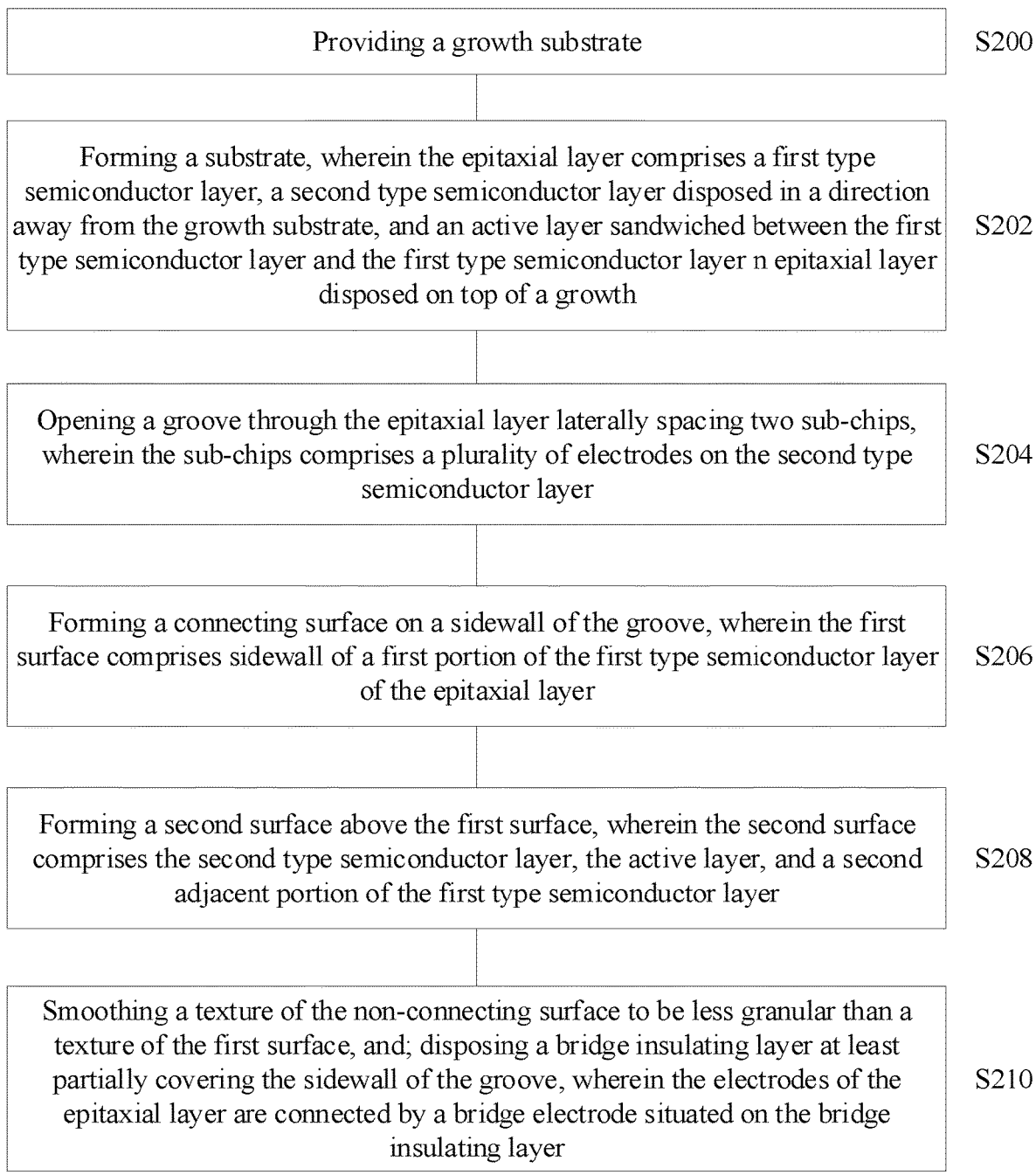
FIG. 9 is an exemplary flow chart illustrating a method for producing an LED sub-chip according to another aspect of the present disclosure.
Figure 10:
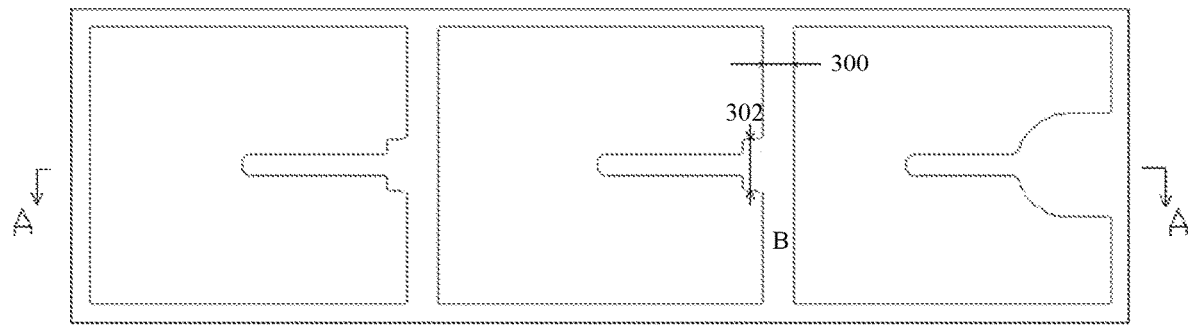
FIG. 10 is the top view showing the high voltage LED chip according to another aspect of the present disclosure.
Figure 11:
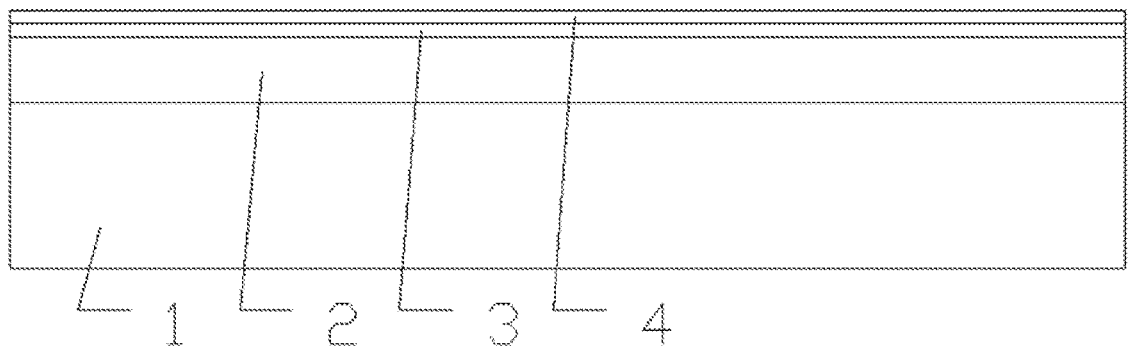
FIG. 11 is the cross-sectional view of a high voltage LED chip according to another aspect of the present disclosure.

In another aspect, as shown in FIG. 9, a method for manufacturing an LED sub-chip, comprising: providing a growth substrate S200; forming an epitaxial layer disposed on top of a growth substrate, wherein the epitaxial layer comprises a first type semiconductor layer, a second type semiconductor layer disposed in a direction away from the growth substrate, and an active layer sandwiched between the first type semiconductor layer and the first type semiconductor layer S202; opening a groove through the epitaxial layer laterally spacing two sub-chips, wherein the sub-chips comprises a plurality of electrodes on the second type semiconductor layer S204; forming a connecting surface on a sidewall of the groove, wherein the first surface comprises sidewall of a first portion of the first type semiconductor layer of the epitaxial layer S206; forming a second surface above the first surface, wherein the second surface comprises the second type semiconductor layer, the active layer, and a second adjacent portion of the first type semiconductor layer S208; and smoothing a texture of the second surface to be less granular than a texture of the first surface, and disposing a bridge insulating layer at least partially covering the sidewall of the groove, wherein the electrodes of the epitaxial layer are connected by a bridge electrode situated on the bridge insulating layer S210. Preferably, as shown in FIG. 10, the groove B has a lateral width between two sub-chips 300 and a horizontal width 302, and wherein the lateral width is shorter than a horizontal width. Optionally, the first type semiconductor layer 2 is an N-type semiconductor layer, in particular, an N-type GaN layer; the second type semiconductor layer 4 is a P-type semiconductor layer, and particularly a P-type GaN layer as shown in FIG. 11, which shows the cross-sectional view of the high voltage LED chip after S202.

Figure 12:
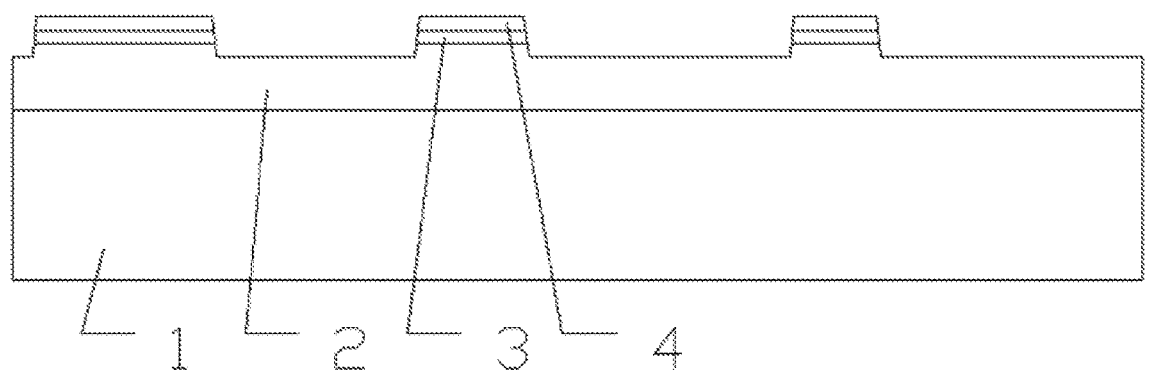
FIG. 12 is the cross-sectional view of a high voltage LED chip according to another aspect of the present disclosure.
Figure 13:
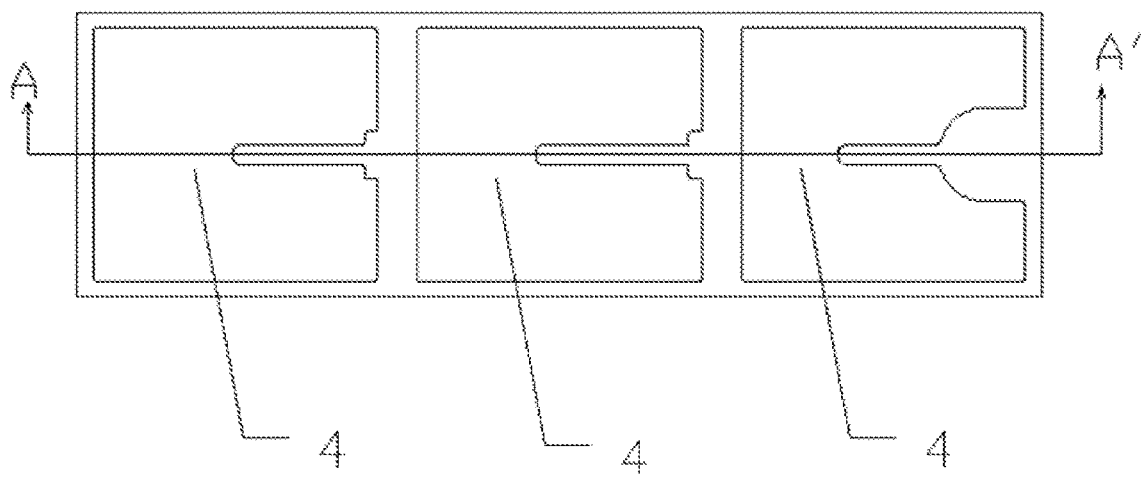
FIG. 13 is the top view showing the high voltage LED chip in FIG. 12.

Referring to FIG. 12 and FIG. 13, it is to be noted that FIG. 12 is a cross-sectional view taken along line AA' of FIG. 13, and thus only a partial structure is shown. Optionally, in an aspect, a portion of the second type semiconductor layer 4, a portion of the active layer 3, and a portion of the first type semiconductor layer 2 are etched away by an etching process, thereby exposing the first type semiconductor layer 2. The appearance of the LED chip is defined by partial etching.

Figure 14:
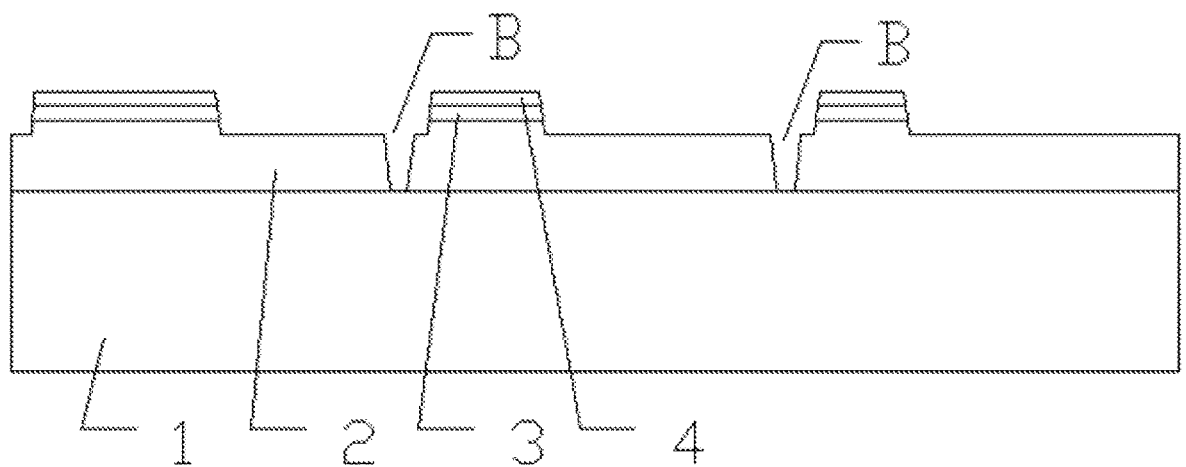
FIG. 14 is the cross-sectional view of a high voltage LED chip according to another aspect of the present disclosure.
Figure 15:
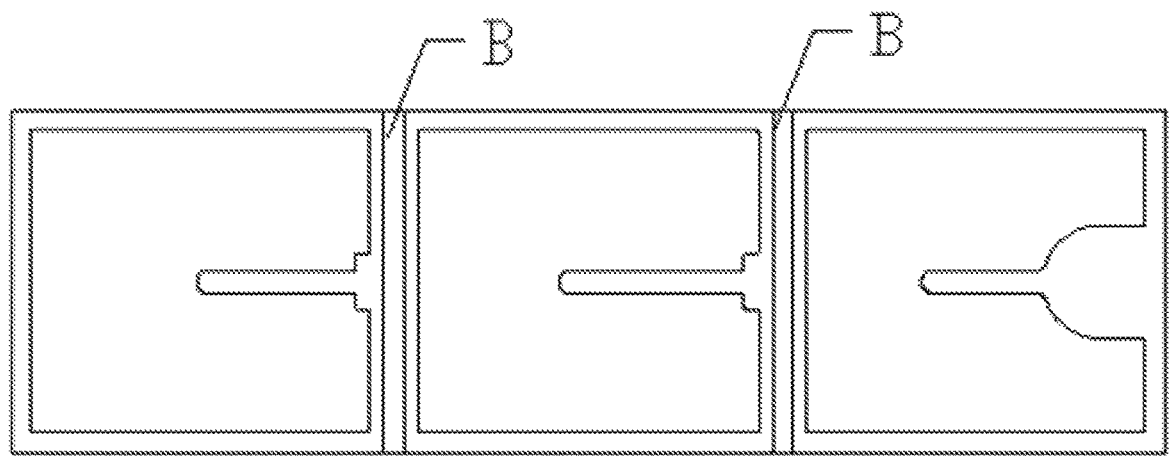
FIG. 15 is the top view showing the high voltage LED chip in FIG. 14.

Thereafter, the first type semiconductor layer 2 is further etched so that a groove B penetrating through the epitaxial layer separating the two sub-chips is formed as shown in FIG. 14 and FIG. 15.

Figure 18:
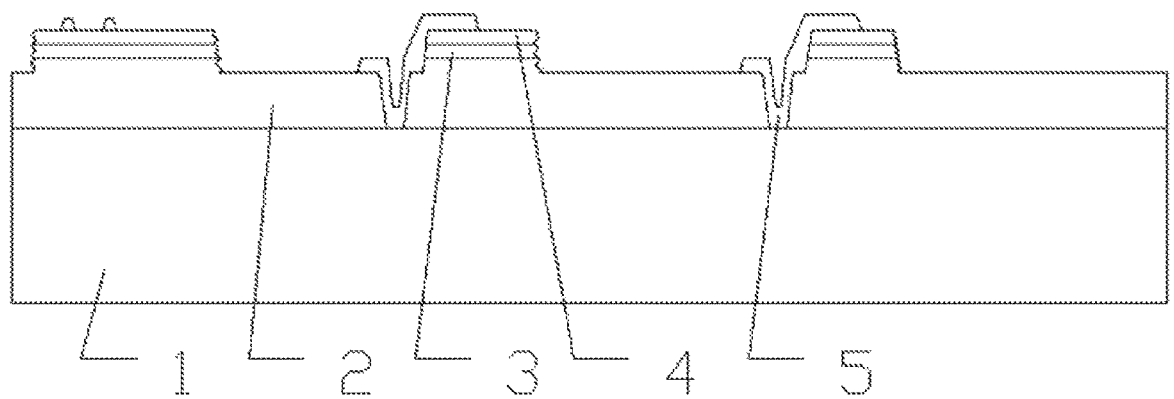
FIG. 18 is the cross-sectional view of a high voltage LED chip according to another aspect of the present disclosure.
Figure 19:
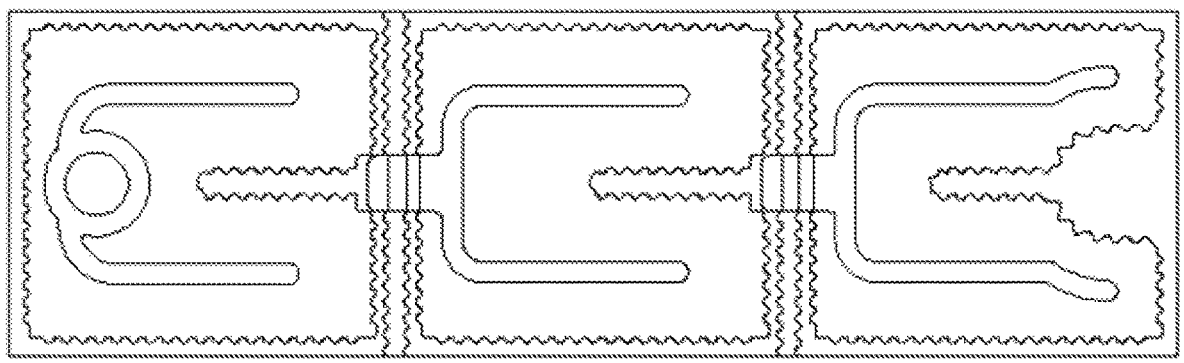
FIG. 19 is the top view showing the high voltage LED chip in FIG. 18.

The method for manufacturing the LED sub-chip further comprises smoothing a texture of the second surface to be less granular than a texture of the first surface, and disposing a bridge insulating layer at least partially covering the sidewall of the groove, wherein the electrodes of the epitaxial layer are connected by a bridge electrode situated on the bridge insulating layer S210 may be accomplished by etching sidewalls of the groove not covered by the bridge insulating layer and sidewalls of the epitaxial layer, where the corresponding sidewalls of the respective layers being etched is roughened as shown for example by FIG. 18 and FIG. 19

Preferably, the epitaxial layer may be performed by a wet etching process forming a roughened sidewall.

Figure 16:
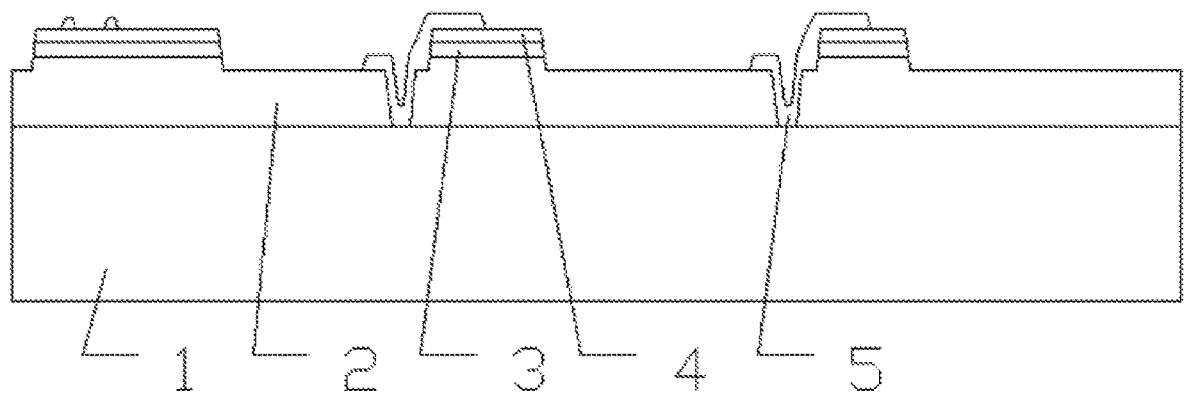
FIG. 16 is the cross-sectional view of a high voltage LED chip according to another aspect of the present disclosure.
Figure 17:
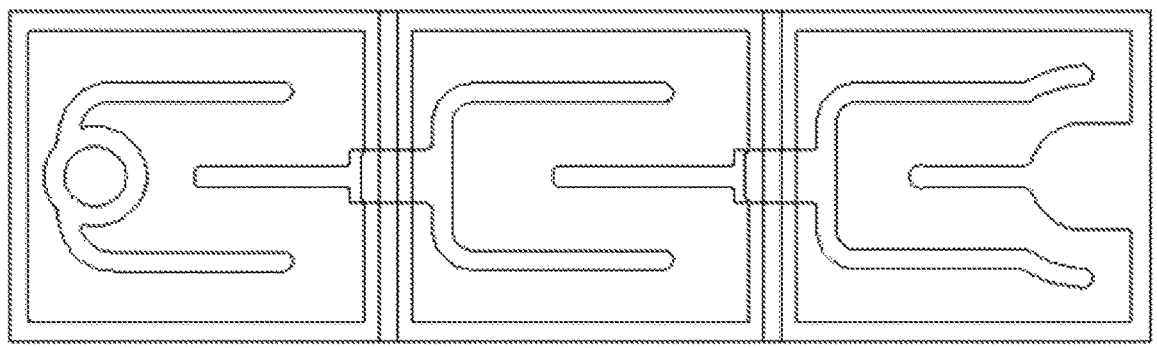
FIG. 17 is the top view showing the high voltage LED chip in FIG. 16.

Referring to FIG. 16 and FIG. 17, a bridge insulating layer 5 is formed on a part of the surface of the second type semiconductor layer 4 and a part of the bottom surface and the side surface (i.e. sidewall) of the groove B. The bridge insulating layer 5 is formed only in a partial region of the groove for subsequently forming the bridge electrode that electrically connects the electrodes on the adjacent two LED sub-chips, and the region outside the partial region may not require the bridge insulating layer.

Figure 6:
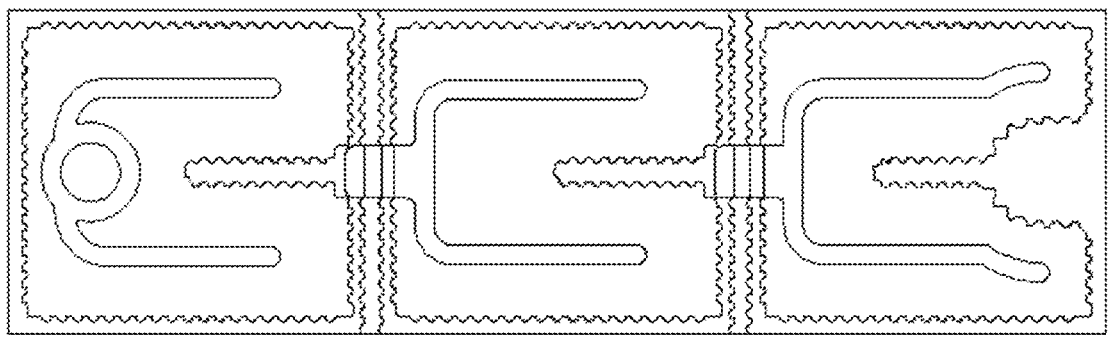
FIG. 6 is the top view showing the high voltage LED Chip according to another aspect of the present disclosure.

Preferably, the growth substrate and the epitaxial layer are immersed in an etching solution for etching. The etching solution etches only the side surface of the epitaxial layer and has no effect on the surface of the second semiconductor layer located on the outer layer, that is, the surface of the P-type layer. The specific etching solution may be TMAH (Tetramethylammonium hydroxide). The side surface of the epitaxial layer etched is shown in FIG. 6.

Figure 7:
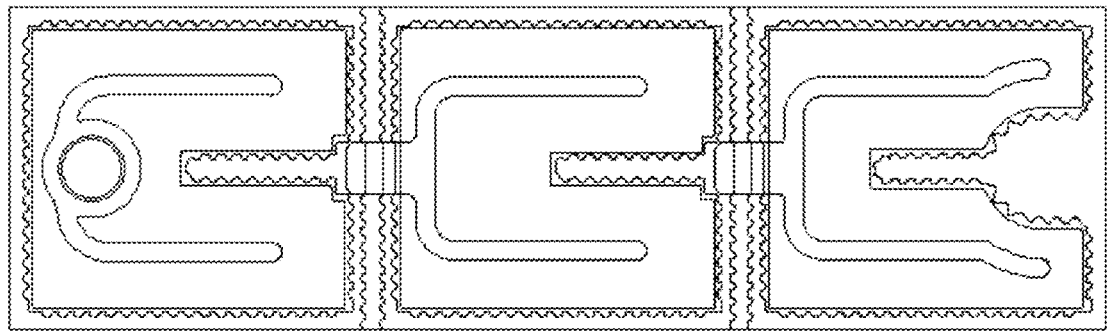
FIG. 7 is the top view showing the high voltage LED Chip according to another aspect of the present disclosure.
Figure 20:
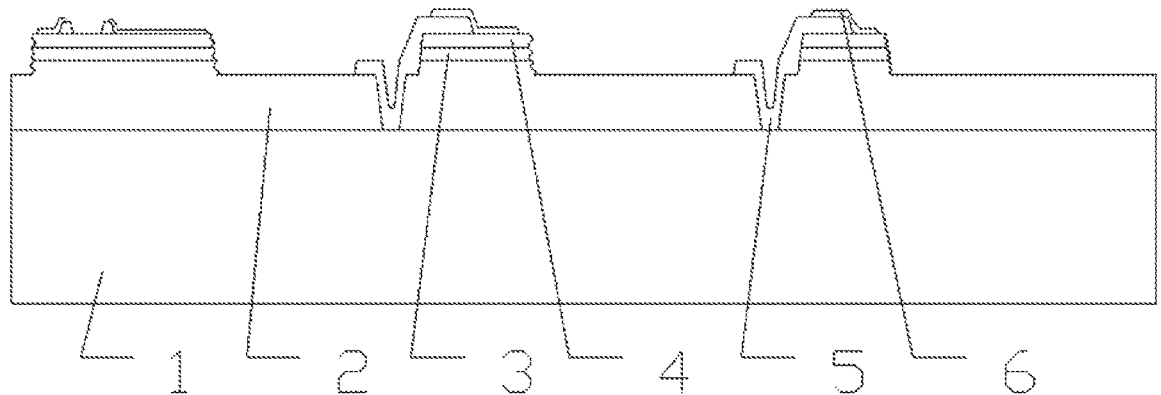
FIG. 20 is the cross-sectional view of a high voltage LED chip according to another aspect of the present disclosure.
Figure 21:
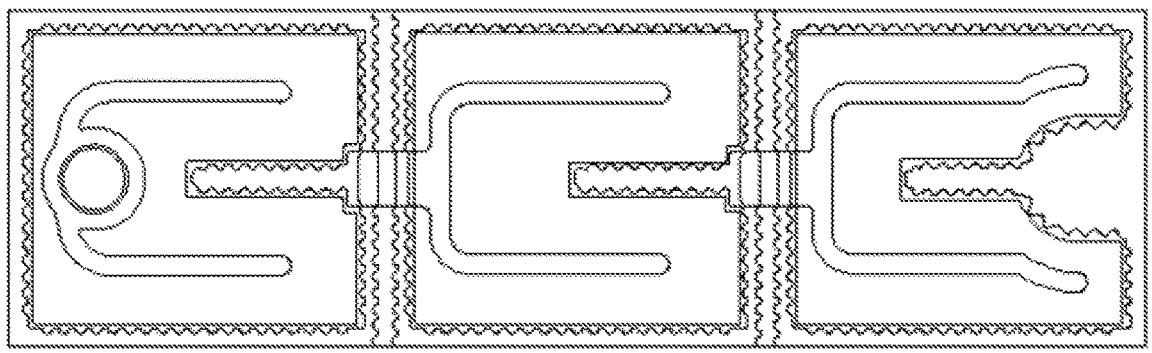
FIG. 21 is the top view showing the high voltage LED chip in FIG. 20.

It should be noted that, before the electrodes are formed, the transparent conductive layer may be further formed. That is, as shown in FIG. 7, FIG. 20 and FIG. 21, before the respective electrodes of the two sub-chips are formed, a transparent conductive layer 6 or 28 is manufactured on the P-type layer (the second type semiconductor layer) and a part of the bridge insulating layer. The transparent conductive layer 6 or 28 is used on the one hand to prepare the bridge electrode for connecting the respective electrodes of the two sub-chips, and on the other hand, is capable of expanding the current, thereby increasing the external luminous efficiency of the LED chip.

A single high-voltage LED chip is formed; it should be noted that, to the disclosure does not limit the number of LED sub-chips in one LED chip in the depicted examples herein, and the various segmentation may be performed according to actual needs in regard to the number of LED sub-chips.

In another aspect, as shown in FIG. 10, a method for manufacturing an LED sub-chip further comprises where the groove B has a lateral width 300 between two sub-chips and a horizontal width 302, and wherein the lateral width is shorter than the horizontal width 302.

FIG. 10 is the top view showing the high voltage LED chip according to another aspect of the present disclosure. The figure illustrates the groove B has a lateral width 300 between two sub-chips and a horizontal width 302, and the lateral width 300 is shorter than the horizontal width 302. Preferably, the lateral width may be 3-12 um, more preferably 5-10 um, even more preferably 6-7 um. Preferably the horizontal width may be 30-60 um, more preferably from 35 to 50 μm, even more preferably from 40 to 45 μm.

Figure 13A:
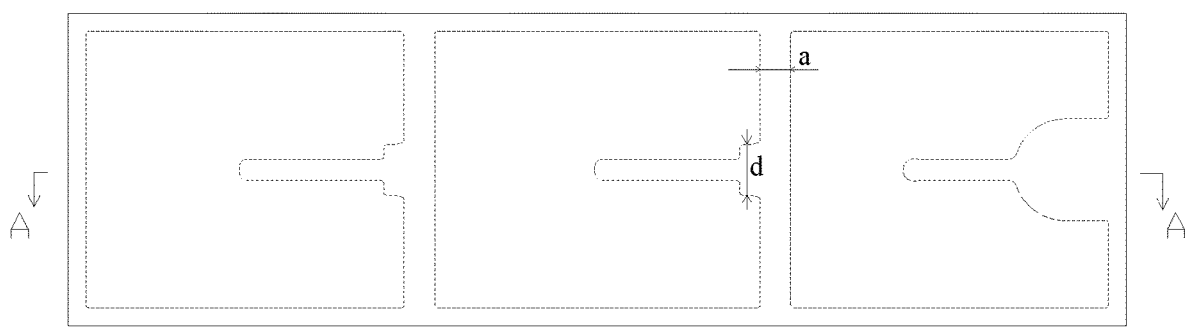
FIG. 13A is the top view showing the high voltage LED chip according to another aspect of the present disclosure.

In another aspect, FIG. 12 shows a growth substrate 1, a first semiconductor layer forming part of the epitaxial layer, an active layer 3, and a second semiconductor layer along line AA' of the top view of FIG. 13A.

In another aspect, a method for manufacturing an LED sub-chip further comprises where the groove has a lateral width 'd' between two sub-chips and a horizontal width "a", and the lateral width is shorter than the horizontal width "d." This is shown structurally in FIG. 13A.

Figure 23:
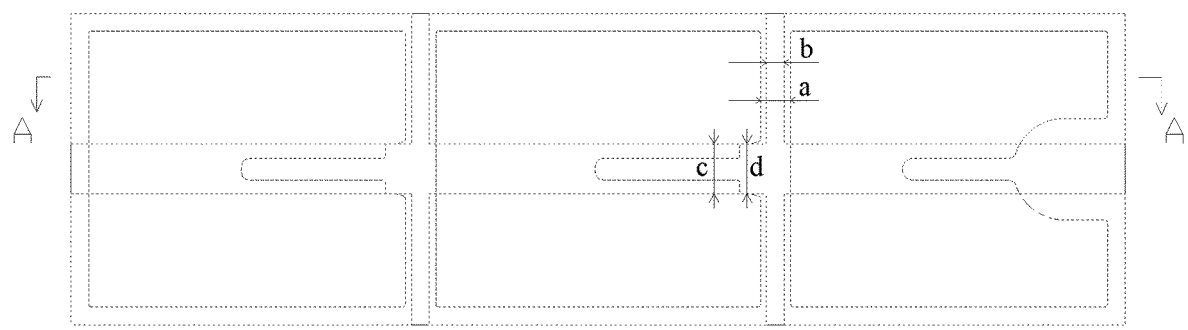
FIG. 23 is the top view showing the high voltage LED chip in FIG. 22.
Figure 25:
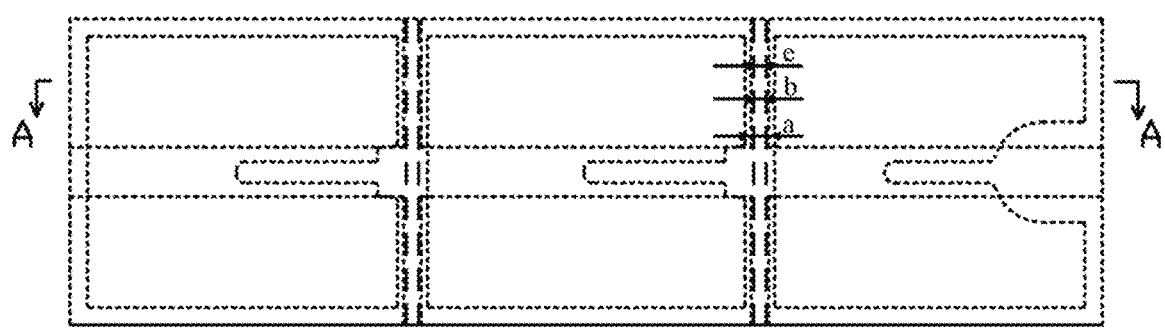
FIG. 25 is the top view showing the high voltage LED chip in FIG. 24.

In another aspect, as shown in FIG. 13A, FIG. 23, and FIG. 25, when etching is performed. The etch pattern layer 10 is a separate or stand-alone structure. The lateral spacing "b" between the adjacent two sub-chips, in projection perpendicular to the direction of the substrate, is within "a," and the two non-overlapping, two-sided pitch 0.5 to 3.0 um, preferably 1 to 2 um, the longitudinal spacing "c" between the cells, in the direction perpendicular to the projection direction of the substrate, "c" and "d" overlap, the chemicals used include but not limited to $SiO_2$, $Si_3N_4$, $Al_2O_3$, and other oxynitride insulation material.

Figure 24:
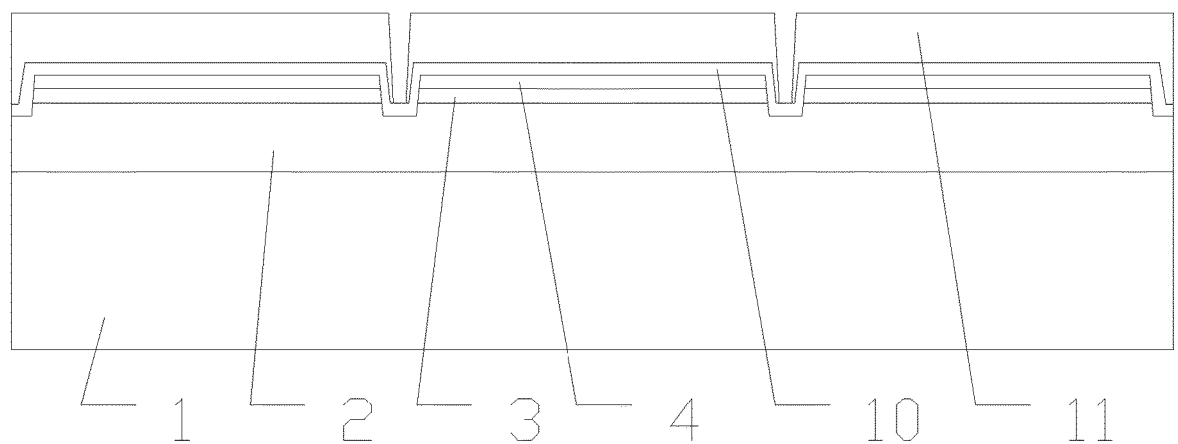
FIG. 24 is the cross-sectional view of a high voltage LED chip according to another aspect of the present disclosure.

Preferably, shown in FIG. 24 and FIG. 25, using a photolithography method, on the side of the P-type layer, the N-type layer, and the P-type layer/N-type layer/active layer, the etched pattern layer is to form a (lithographic) insulating protective layer 11, and the (lithographic) insulating protective layer 11 separates LED sub-chips, a lateral spacing "e" between the sub-chips, in the direction perpendicular to the projection of the substrate, "e" is located inside "b", and the two do not overlap, the distance between the two sides is 0.5 to 2.0 um, preferably 1 to 1.5 um.

Preferably, a mixed gas of $Ar/Cl_2/BCl_3$ may be used; as different etching gas has different etching selectivity ratios for the photoresist and the anti-etching layer, the etching photoresist is faster, and the etching and etching of the patterned layer 10 may be slower, as shown in FIG. 22 to FIG. 26. This result in the first surface angled more orthogonally with respect to a horizontal surface of the growth substrate than the second surface to the horizontal surface. In addition, the BOE solution may be used to remove the residual etched layer.

In another aspect, before the electrodes are formed, the transparent conductive layer 6 may be further formed. That is, as shown in FIG. 20 and FIG. 21; before forming the first electrode 71 and the second electrode 72, the transparent conductive layer 6 is formed on the P-type layer and bridged part of the bridge insulating layer, as shown in the figures. The transparent conductive layer 6 is used on the one hand to prepare the bridge electrode for connecting the first electrode and the second electrode, and on the other hand, is capable of enhancing the current, thereby increasing the efficiency of the LED chip.

Figure 22:
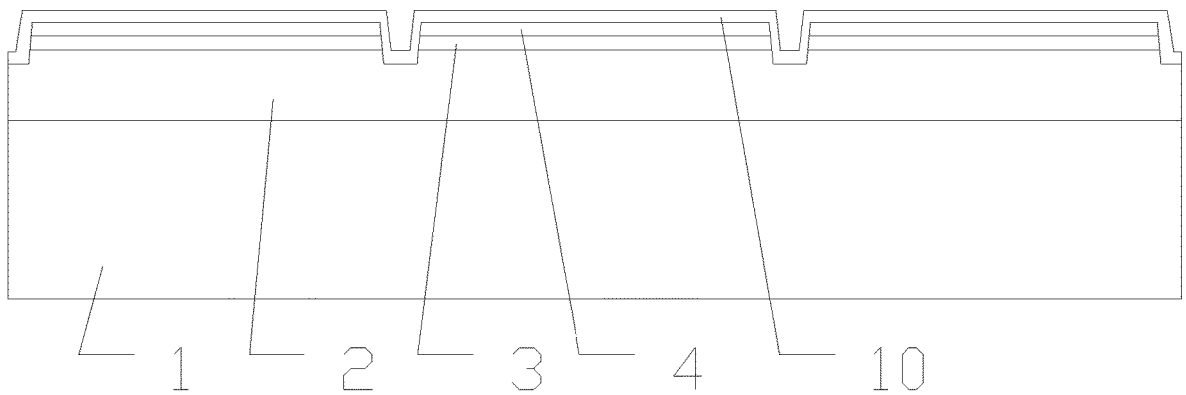
FIG. 22 is the cross-sectional view of a high voltage LED chip according to another aspect of the present disclosure.

In another aspect, as shown in FIG. 22 which is the cross-sectional view of a high voltage LED chip along line AA' of FIG. 23, a growth substrate 1, a first semiconductor layer forming part of the epitaxial layer, an active layer 3, a second semiconductor layer, and a patterned layer 10 pertaining to the top view of FIG. 23.

In another aspect, as shown in FIG. 24 which is the cross-sectional view of a high voltage LED chip along line AA' of FIG. 25, a growth substrate 1, a first semiconductor layer forming part of the epitaxial layer, an active layer 3, a second semiconductor layer, a patterned layer 10, and a (lithographic) insulating protective layer 11 pertaining to the top view of FIG. 25.

Figure 26:
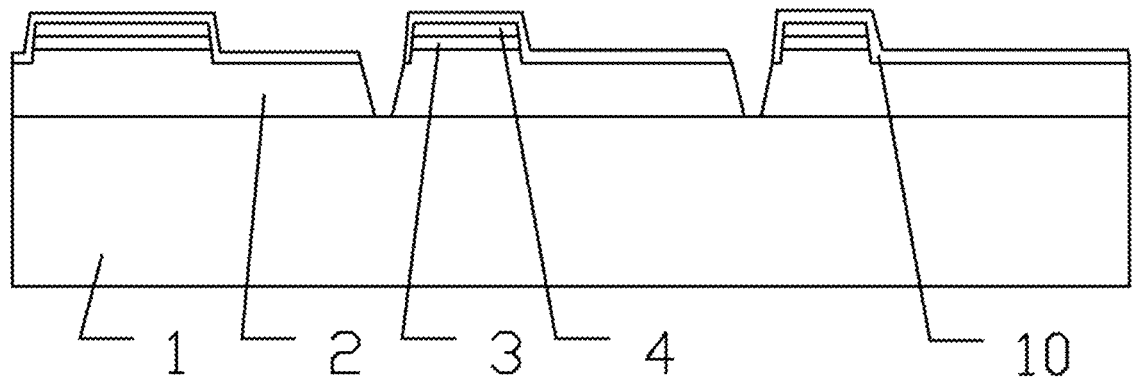
FIG. 26 is the cross-sectional view of a high voltage LED chip according to another aspect of the present disclosure.
Figure 27:
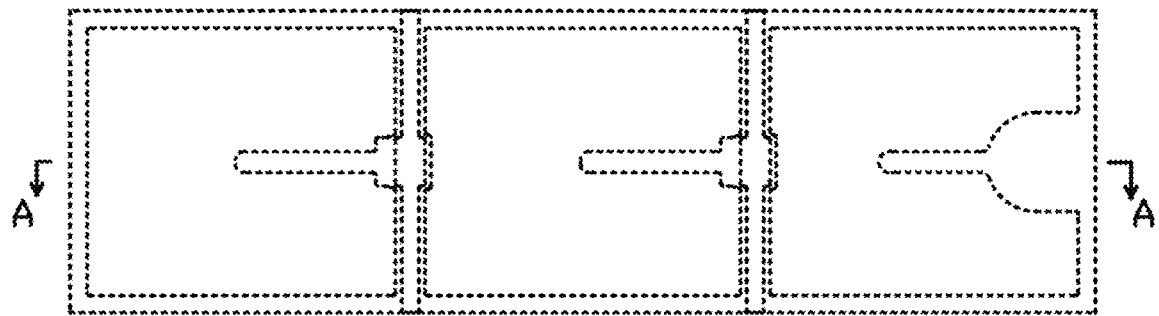
FIG. 27 is the top view showing the high voltage LED chip in FIG. 26.

In another aspect, as shown in FIG. 26 which is the cross-sectional view of a high voltage LED chip along line AA' of FIG. 27, a growth substrate 1, a first semiconductor layer forming part of the epitaxial layer, an active layer 3, a second semiconductor layer, a patterned layer 10 pertaining to the top view of FIG. 27.

In another aspect of the LED chip structure, the connecting surface comprises a connecting region that corresponds to the first surface of the groove. Preferably, in the connecting region the side of the groove may have a tilt angle of 20 degrees to 50 degrees in relation to the bottom of the groove. More preferably, the tilt angle is 45 degrees.

In another aspect, the tile angle of the side of the groove the in relation to bottom of the groove for the non-connecting surface may be between 60 degrees to 90 degrees. Preferably, the tilt angle is 85 degrees. The disclosed tile angle should not be construed as limiting.

In another aspect, the width of the groove between the two adjacent LED sub-chips is shown in FIG. 10. The width is greater for the connecting region of the connecting surface than the non-connecting surface.

In this disclosure, a method for fabricating a high voltage LED chip structure is provided. The groove, which may also be referred as the cell isolation trench, formed by the above manufacturing method is divided into two parts, including a cell isolation trench and a non-connected cell isolation trench. In the direction of the center line of the two adjacent LED chips, the width of the cell isolation trench of the non-joining region is smaller than the width of the cell isolation trench of the connection region. The slope of the sidewall of the cell isolation trench of the non-connected region is greater than the connection Side wall of the cell isolation trench degree. That is, the slope of the cell isolation trench in the connection region is slower, and the slope of the cell isolation trench in the non-connection region is larger and the slope is steeper, so that the steeper slope of the chip area at the same depth is smaller, thereby reducing cell isolation slot in non-connected area. The area, which in turn increases the area of the light-emitting area, improves the light efficiency of the high-voltage LED chip.

Additionally or alternatively, etching the epitaxy and forming a cell isolation trench may include at least following four steps. 1) Forming a etch-etching pattern layer covering a portion of the surface of the LED sub-chips and exposing a region where the cell isolation trench is to be formed, and an extension region corresponding to the cell isolation trench of the connection region. The extension region is an extended area located on the LED sub-chips, where the extended area refers to the connection cell isolation trench extending in the direction of the center line of two adjacent LED sub-chips. 2) Forming a photoresist layer on the LED sub-chips, the photoresist layer covering a surface of each of the LED chips, and exposing a region of the cell isolation trench to be formed in the non-joining region. In the direction along the center line of the adjacent two LED chip particles, the width of the cell isolation trench region to be formed in the non-joining region is smaller than the distance between the adjacent two of the stop etching pattern layers. 3) Etching the exposed region of the photoresist layer to form a cell isolation trench. 4) Removing the etch stop pattern layer.

In another aspect, in FIG. 23, lateral distances ("a" and "b") between the two adjacent LED sub-chips are illustrated. The longitudinal spacing between "a" and "b" do not overlap, where "b" is located inside "a." (towards of external side of the LED sub-chips) The longitudinal distance between "a" and "b" are 0.5 µm-3.0 µm, preferably 1 µm to 2 µm. Orthogonal to "a" and "b" is "c," where "c" may overlap with "d." Optionally, material for stopping the etching pattern layer may be an oxynitride insulating material such as $SiO_2$, $Si_3N_4$ or $Al_2O_3$.

In another aspect, in FIG. 25, the photoresist layer may overlay on LED sub-chips such that the photoresist layer covers the surface of LED sub-chips. And, the spacing of adjacent photoresist layer, in a lateral direction, is "e," where "e" is located at the inside of "b" (towards of external side of the LED sub-chips); "e" and "b" do not overlap. Preferably, the spacing between "b" and "e" may be 0.5 µm to 2.0 µm of the lateral spacing of the two, preferably 1 µm to 1.5 µm.

Other aspects of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within the known or customary practice in the art. It is intended that the specification and examples be considered as exemplary only, with a true scope and spirit of the disclosure being indicated by the following claims.

It will be appreciated that the present disclosure is not limited to the exact examples described above and illustrated in the accompanying drawings, and that various modifications and changes can be made without departing from the scope thereof. It is intended that the scope of the disclosure only be limited by the appended claims.

What is claimed is:

1. A light-emitting diode (LED) sub-chip, comprising:
an epitaxial layer disposed on a growth substrate, wherein the epitaxial layer comprises a plurality of electrodes;
a first groove disposed between the LED sub-chip and a second LED sub-chip and a second groove disposed between the LED sub-chip and a third LED sub-chip, wherein the first and second grooves respectively penetrate through the epitaxial layer separating the two sub-chips;
a bridge insulating layer at least partially covering a sidewall of the first groove and a sidewall of the second groove, wherein each sidewall comprises: a first surface and a second surface close to the first surface; and
a bridge electrode on the bridge insulating layer, wherein the bridge electrode connects respective electrodes of the two sub-chips at the first surface,
wherein the first surface is less inclined with respect to a horizontal surface of the growth substrate at locations where the first or second groove is covered by the bridge insulating layer than at locations where the first or second groove is not covered by the bridge insulating layer,
wherein the second surface sits above the first surface, the first surface is angled with respect to the horizontal surface of the growth substrate within a first range of degree, the second surface is angled with respect to the horizontal surface within a second range of degree, any degree in the first range of degree is greater than any degree in the second range of degree, and the second surface is irregularly roughened,
wherein a first angle between the first surface of the first groove and a vertical line that is vertical to the horizontal surface is greater than a second angle between the first surface of the second groove and the vertical line.

2. The LED sub-chip of claim 1, wherein the second surface is angled more orthogonally with respect to a horizontal surface of the growth substrate than the first surface to the horizontal surface.

3. The LED sub-chip of claim 2, wherein the epitaxial layer comprises a first type semiconductor layer, a second type semiconductor layer disposed in a direction away from the growth substrate, and an active layer sandwiched between the first type semiconductor layer and the second type semiconductor layer.

4. The LED sub-chip of claim 3, wherein the second surface comprises sidewalls of the second type semiconductor layer, the active layer and a portion of the first type semiconductor layer corresponding to the groove covered by the bridge insulating layer.

5. The LED sub-chip of claim 4, wherein the second surface is irregularly roughened with a serrated pattern.

6. The LED sub-chip of claim 5, wherein the serrated pattern comprises an irregular serrated pattern.

7. The LED sub-chip of claim 4, further comprising a transparent conductive layer formed on a surface of the bridge insulating layer and on a surface of the second type semiconductor layer facing away from the growth substrate.

8. The LED sub-chip of claim 3, further comprising an insulating protective layer covering an outer surface of the entire LED sub-chip except for upper surfaces of the plurality of electrodes.

* * * * *